US012633501B2

(12) United States Patent
Baluja et al.

(10) Patent No.: US 12,633,501 B2
(45) Date of Patent: May 19, 2026

(54) GAS DISTRIBUTION ASSEMBLIES FOR SEMICONDUCTOR DEVICES

(71) Applicant: Applied Materials, Inc., Santa Clara, CA (US)

(72) Inventors: Sanjeev Baluja, Campbell, CA (US); Chaowei Wang, San Diego, CA (US); Kevin Griffin, Livermore, CA (US); Kenneth Brian Doering, San Jose, CA (US); Hanhong Chen, Milpitas, CA (US); Joseph AuBuchon, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 160 days.

(21) Appl. No.: 18/225,454

(22) Filed: Jul. 24, 2023

(65) Prior Publication Data

US 2025/0037978 A1 Jan. 30, 2025

(51) Int. Cl.
*H01J 37/32* (2006.01)
*H01L 21/67* (2006.01)
*H10P 72/00* (2026.01)

(52) U.S. Cl.
CPC .... *H01J 37/32495* (2013.01); *H01J 37/3244* (2013.01); *H10P 72/0402* (2026.01); *H01J 2237/332* (2013.01)

(58) Field of Classification Search
None
See application file for complete search history.

(56) References Cited

U.S. PATENT DOCUMENTS

| | | | |
|---|---|---|---|
| 8,100,081 B1 * | 1/2012 | Henri | C23F 4/00 |
| | | | 156/345.35 |
| 9,677,176 B2 | 6/2017 | Chandrasekharan et al. | |
| 10,378,107 B2 | 8/2019 | Chandrasekharan et al. | |
| 11,049,694 B2 | 6/2021 | Aubuchon et al. | |
| 11,583,816 B2 | 2/2023 | Lee et al. | |

(Continued)

FOREIGN PATENT DOCUMENTS

| | | |
|---|---|---|
| KR | 101670804 B1 | 10/2016 |
| TW | 202249062 A | 12/2022 |

(Continued)

OTHER PUBLICATIONS

PCT International Search Report and Written Opinion in PCT/US2024/038952 dated Nov. 5, 2024, 10 pages.

(Continued)

*Primary Examiner* — Shamim Ahmed
(74) *Attorney, Agent, or Firm* — SERVILLA WHITNEY LLC

(57) ABSTRACT

Gas distribution assemblies for semiconductor devices are described. The gas distribution assemblies include a backplate, a faceplate, a counterbored hole, and at least one orifice. The at least one orifice includes, for example, at least one straight orifice, or at least two angled orifices. Some embodiments of the gas distribution assemblies provide for reduced plasma damage in a processing chamber. Some embodiments of the gas distribution assemblies provide for reduced jetting on a substrate in a processing chamber. Methods of reducing plasma damage in gas distribution assemblies are also described.

5 Claims, 7 Drawing Sheets

(56)                    References Cited

U.S. PATENT DOCUMENTS

| | | | |
|---|---|---|---|
| 2006/0090850 A1 * | 5/2006 | Laflamme, Jr. ... | H01L 21/67069 |
| | | | 156/345.33 |
| 2014/0158786 A1 * | 6/2014 | Santo ............... | C23C 16/45565 |
| | | | 239/548 |
| 2016/0340782 A1 * | 11/2016 | Chandrasekharan ........................ | |
| | | | C23C 16/45544 |
| 2016/0343595 A1 | 11/2016 | Lind et al. | |
| 2016/0372318 A1 | 12/2016 | Varadarajan et al. | |
| 2020/0276785 A1 | 9/2020 | Parkhe et al. | |
| 2021/0098231 A1 | 4/2021 | Carducci et al. | |
| 2023/0193463 A1 | 6/2023 | Patel H B et al. | |
| 2023/0294116 A1 | 9/2023 | Iyengar et al. | |

FOREIGN PATENT DOCUMENTS

| | | | |
|---|---|---|---|
| WO | 2019032468 A1 | 2/2019 | |
| WO | 2021010952 A1 | 1/2021 | |

OTHER PUBLICATIONS

U.S. Appl. No. 17/827,652, filed May 27, 2022, 48 pages.
U.S. Appl. No. 63/434,316, filed Dec. 21, 2022, 41 pages.

* cited by examiner

103

105

107

103

107A

109

109B

107B

107B

GAS DISTRIBUTION ASSEMBLIES FOR SEMICONDUCTOR DEVICES

TECHNICAL FIELD

Embodiments of the present disclosure pertain to the field of semiconductor device manufacturing. More particularly, embodiments of the disclosure are directed to gas distribution assemblies for semiconductor processing chambers and methods of reducing plasma damage in gas distribution assemblies.

BACKGROUND

Many semiconductor processes involve the use of gas distribution assemblies, e.g., plates and/or showerheads, in processing chambers. During semiconductor manufacturing, a substrate is subjected to many different processes that incorporate a gas flow across the substrate surface, such as, for example, deposition, etching, cleaning, and film treatment processes. Current processing chamber hardware often exhibit on-wafer non-uniformity as a result of non-uniform gas exposure. For example, the flow rate of a gas at the center of the substrate may be different than the flow rate at the out peripheral edge of the substrate, creating a radial on-wafer non-uniformity in the quality of semiconductor devices being manufactured.

Vapor deposition processes, e.g., chemical vapor deposition (CVD) and atomic layer deposition (ALD), involve introducing and removing incompatible precursors. During formation of a silicon nitride (SiN) film on a substrate, for example, defects are detected with silicon carbooxynitride (SiCON), fluorine (F), and silicon oxide (SiO) particles. It has been observed that the source of the particles causing damage/defects can be traced to the o-rings connecting the faceplate and backplate in a gas distribution assembly. The ignition of plasma, which is commonly used in many vapor deposition processes, etches and degrades the o-rings used to connect the faceplate and backplate. Generally, using silicone o-rings, for example, has no impact on the growth per cycle (GPC) in an ALD process, but there is a significant amount of silicon carbooxynitride (SiCON) particles coming out as a result of the plasma. Using FFKM o-rings, for example, has a significant amount of fluorine (F) particles coming out as a result of the plasma, which reduces the GPC significantly.

It has been discovered that an absolute pressure of greater than or equal to 10 Torr at a location of the at least one o-ring is the pressure minimum to extinguish the plasma. Current orifice designs, as an example, have a diameter of approximately 2 mm and a height of approximately 9 mm. In current orifice designs, the pressure at a location of the o-rings is in a range of from about 3 Torr to about 4 Torr, such that the plasma is not extinguished at the o-rings and the o-rings are susceptible to plasma damage.

Methods of designing flow paths that increases pressure at the o-ring interface and suppresses plasma generation have been explored. One solution is to reduce diameter of the gas flow hole, but this results in higher gas velocity and "jetting" to the wafer that compromises on-wafer film uniformity.

Accordingly, there is a need for improved gas distribution assembly designs for semiconductor processing chambers and methods of reducing plasma damage and jetting effects in gas distribution assemblies.

SUMMARY

One or more embodiments are directed to a gas distribution assembly for a semiconductor device. The gas distribution assembly comprises: a backplate having a top surface and a bottom surface defining a thickness, and an opening extending through the thickness; a faceplate having a top surface and a bottom surface defining a thickness, the top surface of the faceplate spaced a distance from and facing the bottom surface of the backplate, the faceplate and the backplate connected by at least one o-ring; at least one straight orifice extending through a top portion of the thickness of the faceplate; and a counterbored hole extending through a bottom portion of the thickness of the faceplate.

Additional embodiments are directed to a gas distribution assembly for a semiconductor device. The gas distribution assembly comprises a backplate having a top surface and a bottom surface defining a thickness, and an opening extending through the thickness; a faceplate having a top surface and a bottom surface defining a thickness, the top surface of the faceplate spaced a distance from and facing the bottom surface of the backplate, the faceplate and the backplate connected by at least one o-ring; a counterbored hole extending through a top portion of the thickness of the faceplate; at least two angled orifices extending through a bottom portion of the thickness of the faceplate; and a second pair of counterbored holes, each of the second counterbored holes extending from a bottom of each of the at least two angled orifices through a bottom portion of the thickness of the faceplate.

Further embodiments are directed to a method of reducing plasma damage in a gas distribution assembly. The method comprises: positioning the gas distribution assembly in a processing chamber. The gas distribution assembly comprises: a backplate having a top surface and a bottom surface defining a thickness, and an opening extending through the thickness, a faceplate having a top surface and a bottom surface defining a thickness, the top surface of the faceplate spaced a distance from and facing the bottom surface of the backplate, the faceplate and the backplate connected by at least one o-ring, at least one orifice extending through a portion of the thickness of the faceplate, the at least one orifice having a diameter in a range of from 0.2 mm to 1 mm and a height in a range of from 1 mm to 5 mm, and a counterbored hole extending through a portion of the thickness of the faceplate. The method further comprises striking a plasma below the bottom surface of the faceplate, the plasma flowing through the counterbored hole and the at least one orifice towards the at least one o-ring, the absolute pressure at a location of the at least one o-ring greater than or equal to 10 Torr to extinguish the plasma prior to reaching the at least one o-ring.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1:
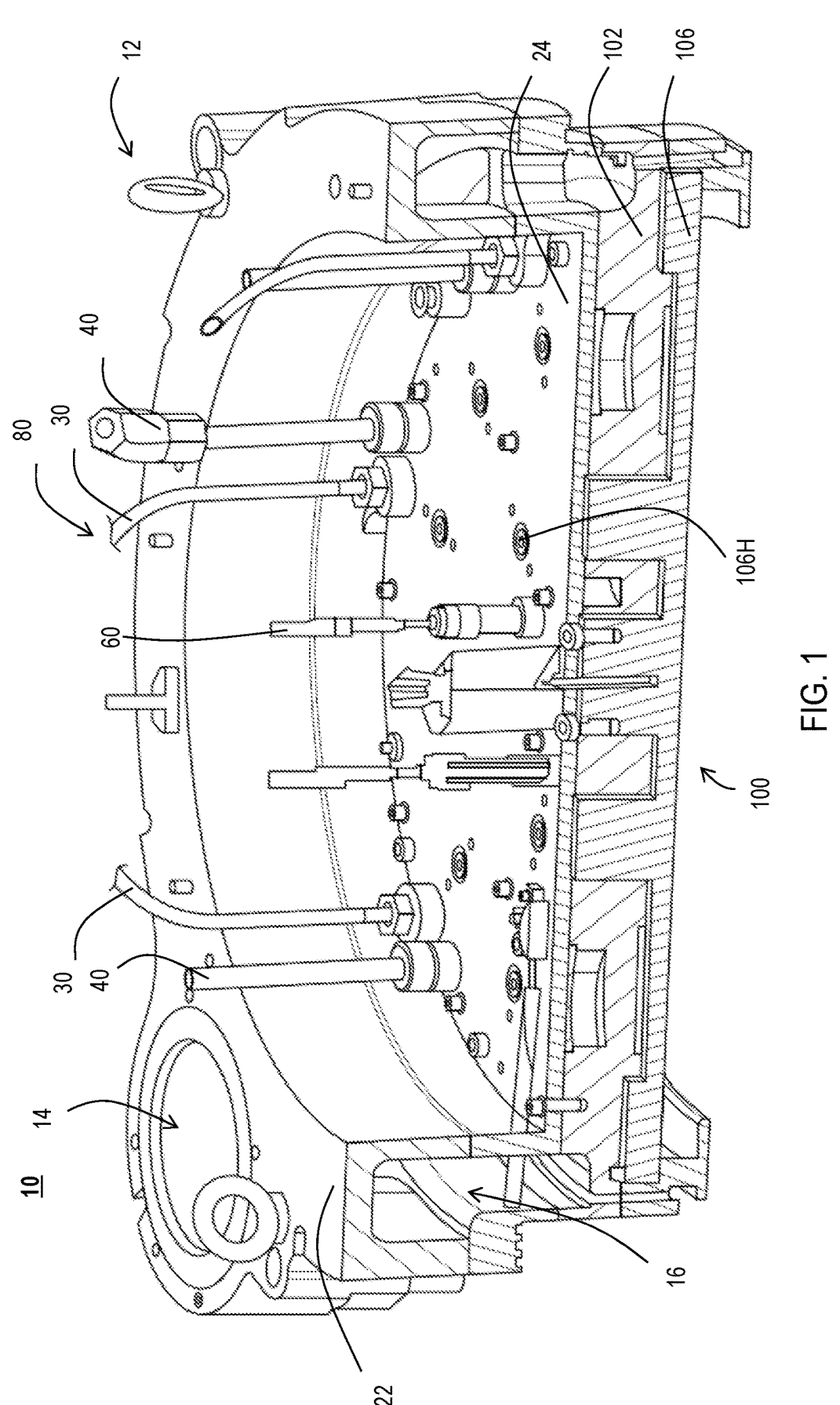
FIG. 1 illustrates a cross-sectional view of a portion of a semiconductor processing chamber according to one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "about" as used herein means approximately or nearly and in the context of a numerical value or range set forth means a variation of ±15%, or less, of the numerical value. For example, a value differing by ±14%, ±10%, ±5%, ±2%, or ±1%, would satisfy the definition of about.

As used in this specification and the appended claims, the term "substrate" or "wafer" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

The term "on" indicates that there is direct contact between elements. The term "directly on" indicates that there is direct contact between elements with no intervening elements.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

Embodiments of the present disclosure advantageously provide improved gas distribution assembly designs for semiconductor processing chambers and methods of reducing plasma damage in gas distribution assemblies. Some embodiments advantageously provide gas distribution assembly designs that reduce or eliminate plasma damage to o-rings. Some embodiments advantageously provide gas distribution assemblies having straight orifice gas holes to achieve the required minimum pressure to suppress plasma at the o-ring location. Some embodiments advantageously provide gas distribution assemblies having angled orifice gas holes to achieve the required minimum pressure to suppress plasma suppress plasma at the o-ring location.

Some embodiments advantageously provide gas distribution assemblies having angled orifice gas holes that reduce jetting effects, and as a result of the reduction in jetting effects, improve on-wafer film uniformity.

Some embodiments advantageously provide gas distribution assemblies having angled orifice gas holes that reduce or eliminate plasma damage to o-rings by achieving high pressure in the gas holes and suppressing plasma at the o-ring location, reduce jetting effects, and as a result of the reduction in jetting effects, also improve on-wafer film uniformity.

The embodiments of the disclosure are described by way of the Figures, which illustrate semiconductor processing chambers and gas distribution assemblies in accordance with one or more embodiments of the disclosure. The structures shown are merely illustrative possible configurations for the gas distribution assemblies and semiconductor processing chambers, and the skilled artisan will recognize that the disclosure is not limited to the illustrated embodiments.

In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

Figure 2:
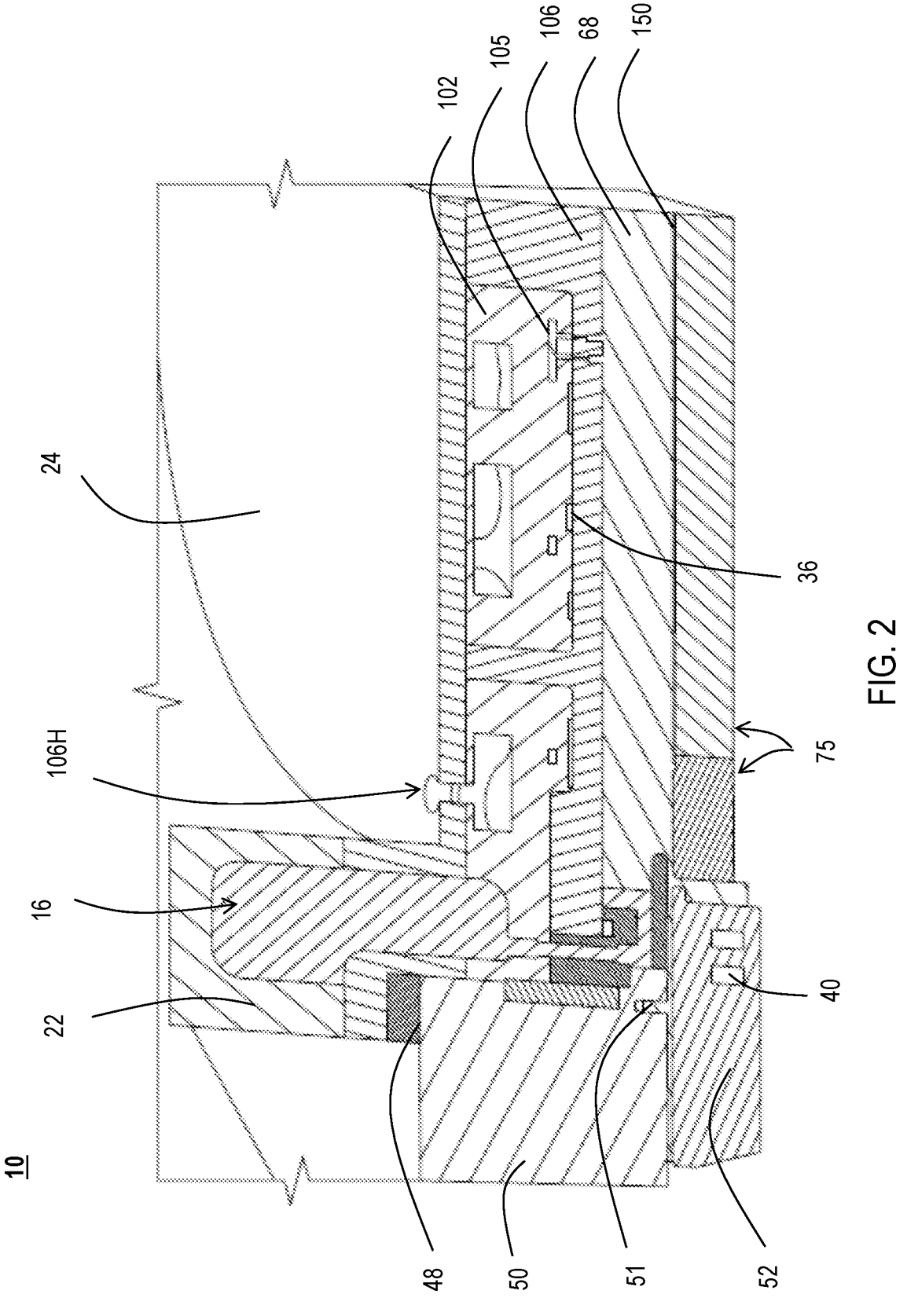
FIG. 2 illustrates a partial cross-sectional side view of a portion of the semiconductor processing chamber of FIG. 1 according to one or more embodiments.

FIG. 1 illustrates a cross-sectional view of a portion of a semiconductor processing chamber 10 according to one or more embodiments. FIG. 2 illustrates a partial cross-sectional side view of a portion of the semiconductor processing chamber 10 of FIG. 1.

The present disclosure should not be construed as being limited to a single semiconductor processing chamber 10. The semiconductor processing chamber 10 may be included as part of a processing apparatus having multiple processing chambers. In one or more embodiments, a substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

The processing chambers described herein (e.g., the semiconductor processing chamber 10), may be included as part of a cluster tool or a clustered system.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Several well-known cluster tools which may be adapted for the present disclosure are the Olympia®, the Continuum®, and the Trillium® tools, all available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants (e.g., reactant). According to one or more embodiments, a purge gas is injected at the exit of the deposition chamber to prevent reactants (e.g., reactant) from moving from the deposition chamber to the transfer chamber and/or additional processing chamber. Thus, the flow of inert gas forms a curtain at the exit of the chamber.

Referring to FIGS. 1 and 2, in one or more embodiments, the illustrated portion of the semiconductor processing chamber 10 includes a gas distribution assembly 100 including a backplate 102 connected to a faceplate 106, a pumping bottom plate 24 on top of the backplate 102, and a pumping top plate 22 on top of the pumping bottom plate 24. In FIG. 2, the gas distribution assembly 100 includes at least one straight orifice 105 extending through a top portion of the thickness of the faceplate 106. The pumping top plate 22 and the pumping bottom plate 24 define a pumping exhaust region 16. The pumping exhaust region 16 evacuates gases to the exhaust pipe 14 and out of the semiconductor processing chamber 10 to provide the desired vacuum. In one or more embodiments, the pumping top plate 22 includes a lifting mechanism 12 (e.g., lifting rings).

The pumping bottom plate 24 includes one or more gas pipe inlets 30, one or more cooling channels 40, and one or more monopole antennas 60 extending therethrough. In one or more embodiments, the one or more monopole antennas 60 extend through the thickness of the pumping bottom plate 24 and may be inserted into a hole 106H of the dielectric resonators 106R, which will be discussed in greater detail below. In some embodiments, each of the monopole antennas 60 are electrically coupled to power sources (e.g., high-frequency emission modules) (not shown).

Referring to FIG. 2, additional processing chamber components are shown. A wafer 150 on a substrate support pedestal 75 is shown. The substrate support pedestal 75 may include any components known to the skilled artisan that are part of wafer processing. In some embodiments, the wafer 150 is positioned on a pedestal, such as substrate support pedestal 75, which is configured to heat the wafer/substrate 150 to a suitable processing temperature. A distance between a bottom surface 106B of the faceplate 106 and a top surface of the wafer 150 defines a process gap 68. A chamber body 50 is shown having a top plate 52 and one or more cooling channels 40 extending through a thickness of the top plate 52.

Figure 3:
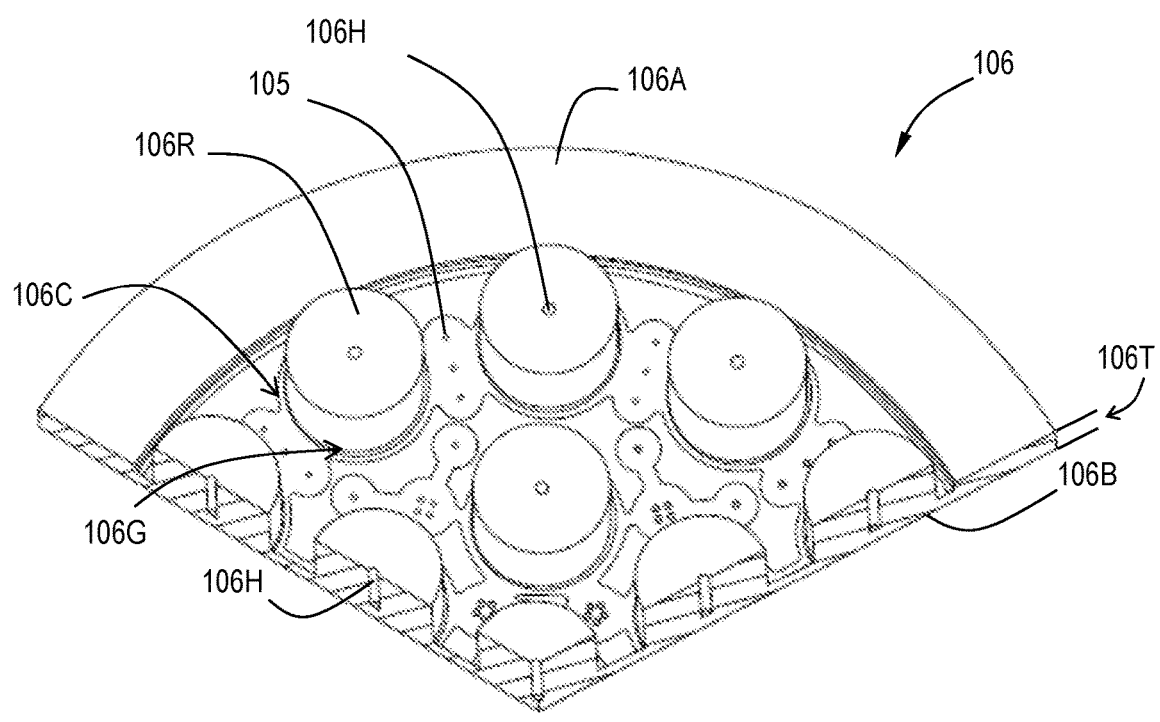
FIG. 3 illustrates a perspective view of a portion of a faceplate of a gas distribution assembly according to one or more embodiments.
Figure 4:
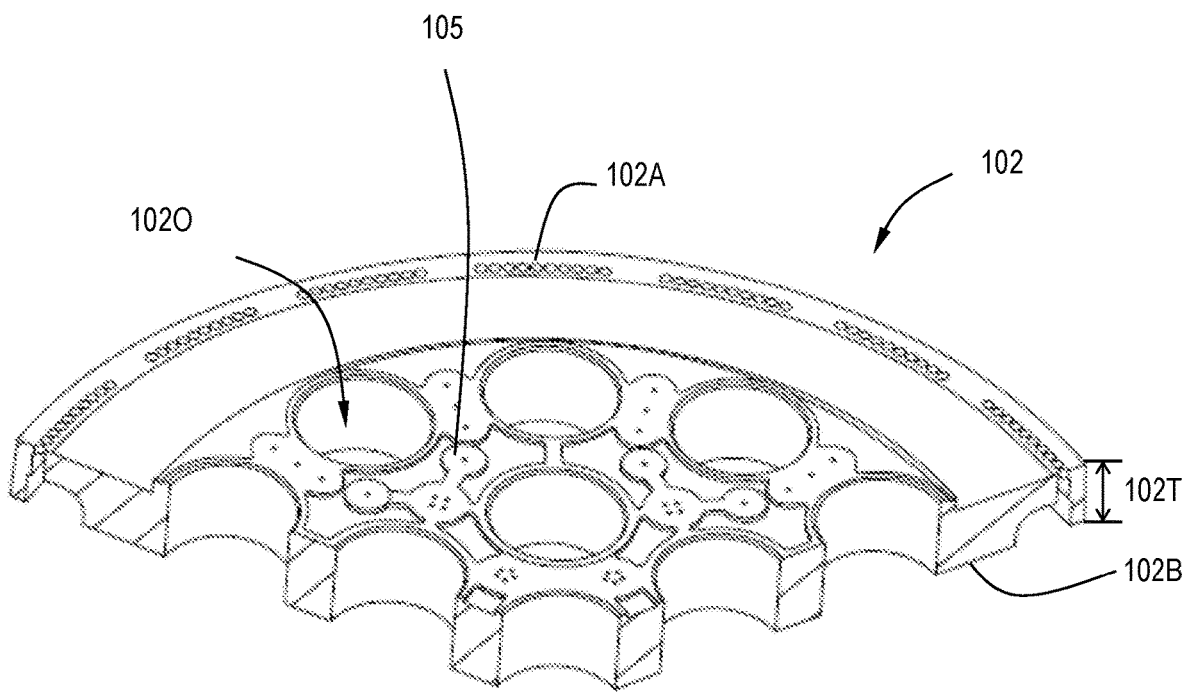
FIG. 4 illustrates a perspective view of a portion of a backplate of a gas distribution assembly according to one or more embodiments.

Referring now to FIGS. 3 and 4, the gas distribution assembly 100 of one or more embodiments includes a backplate 102, a faceplate 106, at least one o-ring 104 that connects the backplate 102 and the faceplate 106, at least one straight orifice 105, and a counterbored hole 107.

FIG. 3 illustrates a perspective view of a portion of the faceplate 106 of the gas distribution assembly 100. In some embodiments, the faceplate 106 is a disc-shaped component having a top surface 106A and a bottom surface 106B defining a thickness 106T, and a plurality of dielectric resonators 106R extending from the top surface 106A. The skilled artisan may recognize and/or term the faceplate 106 as a "source array." In some embodiments, the faceplate 106 and the plurality of dielectric resonators 106R define a monolithic structure. In some embodiments, the faceplate 106 and the dielectric resonators 106R are discrete components. Each of the dielectric resonators 106R correspond to a portion of an applicator (e.g., the one or more monopole antennas 60) used to inject high-frequency electromagnetic radiation into a processing chamber, such as the semiconductor processing chamber 10.

In one or more embodiments, a plurality of cavities 106C are disposed into the top surface 106A of the faceplate 106. In some embodiments, the plurality of cavities 106C do not extend through the thickness 106T of the faceplate 106. Each of the plurality of dielectric resonators 106R may be positioned in a different one of the plurality of cavities 106C. In some embodiments, one or more of the plurality of dielectric resonators 106R comprises a hole 106H in the axial center of the dielectric resonator 106R. In one or more embodiments, the hole 106H extends down from a top surface of the dielectric resonator 106R into the body of the dielectric resonator 106R towards the bottom surface 106B of the faceplate 106. In some embodiments, a bottom of the hole 106H is below (in the Z-direction) the top surface 106A of the faceplate 106. Stated differently, the bottom of the hole 106H may be in the cavity 106C. In other embodiments, the bottom of the hole 106H may be at or above (in the Z-direction) the top surface 106A of the faceplate 106.

In one or more embodiments, there is a space between the plurality of cavities 106C and the corresponding dielectric resonators 106R that defines a gap 106G. The gap 106G is a space between a sidewall of the dielectric resonators 106R and a sidewall of the cavities 106C. In the illustrated embodiment of FIG. 3, each of the dielectric resonators 106R have the same dimensions, although the skilled artisan will appreciate that not all of the dielectric resonators 106R need to have the same dimensions.

In one or more embodiments, the one or more monopole antennas 60 (shown in FIG. 1) may be independently inserted into the hole 106H of the dielectric resonators 106R.

The thickness 106T of the faceplate 106 may be any suitable thickness. In some embodiments, the thickness 106T of the faceplate 106 is in a range of from 6 mm to 11 mm.

FIG. 4 illustrates a perspective view of a portion of a backplate 102 of the gas distribution assembly 100. In some embodiments, the backplate 102 is a disc-shaped component having a top surface 102A and a bottom surface 102B defining a thickness 102T, and a plurality of openings 102O defining a thickness 102T, and a plurality of openings 102O extending through the thickness 102T. The skilled artisan may recognize and/or term the backplate 102 as a "conductive body" or a "facility plate."

The openings 102O extending through the thickness 102T of the backplate 102 may be cooperatively sized to receive the dielectric resonators 106R of the faceplate 106. The thickness 102T of the backplate 102 may be any suitable thickness. In some embodiments, the thickness 102T of the backplate 102 is in a range of from 25 mm to 35 mm.

The backplate 102 and the faceplate 106 may comprise any suitable materials known to the skilled artisan. In some embodiments, the backplate 102 comprises a metallic material. In some embodiments, the metallic material is aluminum (Al).

In some embodiments, the faceplate 106 comprises a ceramic material. In some embodiments, the faceplate 106 comprises a dielectric material. In some embodiments, the faceplate 106 comprises aluminum oxide (e.g., $Al_2O_3$). In some embodiments, the faceplate 106 and the plurality of dielectric resonators 106R comprise the same dielectric material. In some embodiments, each of the faceplate 106 and the plurality of dielectric resonators 106R comprise aluminum oxide (e.g., $Al_2O_3$).

In some embodiments, the top surface 106A of the faceplate 106 is spaced a distance from and facing the bottom surface 102B of the backplate 102. The faceplate 106 and the backplate 102 may be connected using at least one o-ring 104. The at least one o-ring 104 that is used to connect the faceplate 106 and the backplate 102 may include any suitable o-rings known to the skilled artisan. Commonly used o-rings include silicone o-rings and FFKM o-rings, as examples. Any suitable number of o-rings (e.g., the at least one o-ring 104) may be used to connect the faceplate 106 and the backplate 102.

Plasma damage to the o-rings can cause a variety of issues during vapor deposition processes. Generally, using silicone o-rings, for example, has no impact on the growth per cycle (GPC) in a silicon nitride (SiN) ALD process, but there is a significant amount of silicon carbooxynitride (SiCON) particles coming out as a result of the plasma. In an exemplary silicon nitride (SiN) ALD process using silicone o-rings, the GPC in Angstroms per ALD cycle (Å/cycle) at 350° C. is 0.55 Å/cycle and the amount of fluorine (F) particles measured by X-ray photoelectron spectroscopy (XPS) is less than or equal to 1% fluorine (F), on an atomic basis.

Using FFKM o-rings, for example, results in a significant amount of fluorine (F) particles coming out upon striking of the plasma, which reduces the GPC significantly. In an exemplary silicon nitride (SiN) ALD process using FFKM o-rings, the GPC in Angstroms per ALD cycle (Å/cycle) at 350° C. is 0.28 Å/cycle and the amount of fluorine (F) particles measured by XPS is approximately 3.75% fluorine (F), on an atomic basis.

Advantageously, embodiments of the present disclosure provide gas distribution assembly designs that reduce or eliminate plasma damage to o-rings, and as a result, provide no reduction in GPC, and reduce the amount of silicon carbooxynitride (SiCON) particles and/or fluorine (F) particles.

The openings 102O in the top surface 102A of the backplate 102 may have any suitable diameter. In some embodiments, the openings 102O in the top surface 102A of the backplate 102 have a diameter in a range of from 1.2 mm to 2 mm. In some embodiments, the openings 102O in the top surface 102A of the backplate 102 have a diameter in a range of from 1.2 mm to 1.4 mm. In some embodiments, the openings 102O extending through the thickness 102T of the backplate 102 may be cooperatively sized to receive the dielectric resonators 106R of the faceplate 106. Accordingly, in embodiments where the openings 102O are cooperatively sized to receive the dielectric resonators 106R of the faceplate 106, a width of the dielectric resonators 106R corresponds to the diameter of the openings 102O. In specific embodiments, the width of the dielectric resonators 106R and the diameter of the openings 102O is in a range of from 1.2 mm to 2 mm, such as in a range of from 1.2 mm to 1.4 mm.

Figure 5:
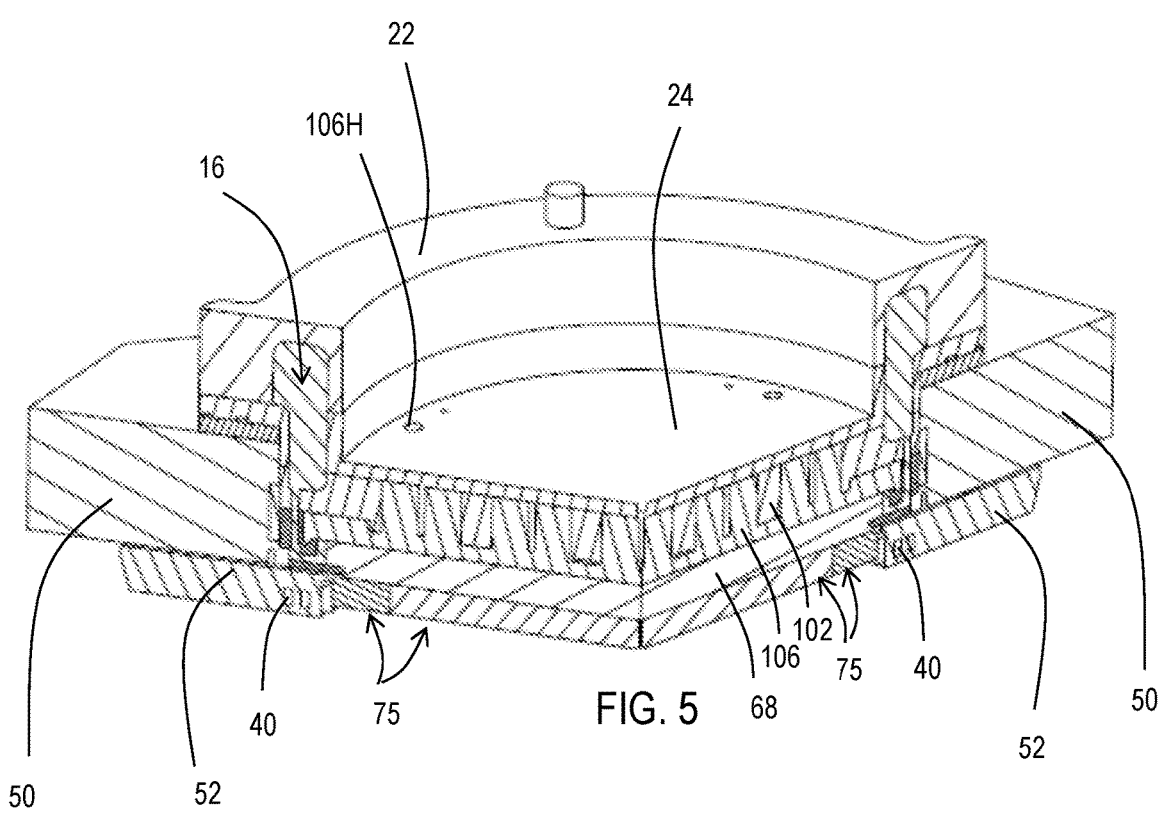
FIG. 5 illustrates a partial cross-sectional view of a portion of the semiconductor processing chamber of FIGS. 1 and 2 according to one or more embodiments.

FIG. 5 illustrates a partial cross-sectional view of a portion of the semiconductor processing chamber 10 of FIGS. 1 and 2 according to one or more embodiments. More particularly, FIG. 5 illustrates a schematic representation of a 120-degree silicon nitride (SiN) model to evaluate the orifice designs using a computational fluid dynamics (CFD)-thermal-finite element analysis (FEA) analysis. The orifice designs analyzed in the 120-degree SiN model of FIG. 5 are described in greater detail below with respect to FIGS. 6-10.

Figure 6:
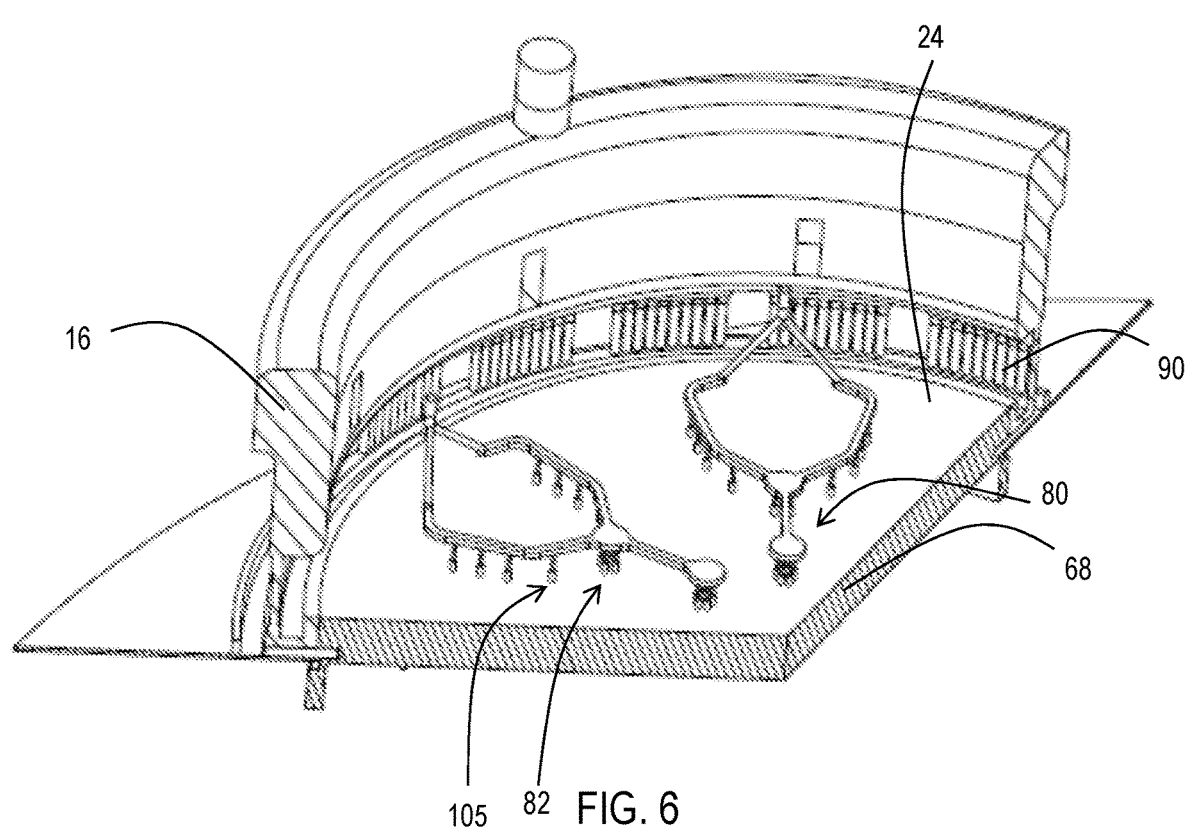
FIG. 6 illustrates an interior view of the gas distribution assembly of FIG. 5.

FIG. 6 illustrates an interior view of the gas distribution assembly 100 of FIG. 5. More particularly, FIG. 6 illustrates a fluid volume model to evaluate the orifice designs and the gas delivery path effect on pressure. FIG. 6 illustrates a portion of the semiconductor processing chamber 10 of FIGS. 1, 2 and 5. Also shown is the pumping exhaust region 16 positioned on a pumping liner 90, which is on top of the pumping bottom plate 24.

In FIG. 6, there are different orifice designs shown along a gas channel 80. The gas channel 80 begins with gas pipe inlet 30, shown in FIG. 1. In some embodiments, the gas channel 80 includes single, straight orifices extending from the gas channel 80 (such as the straight orifice 105 shown in FIGS. 7A and 8). In one or more embodiments, the gas channel 80 includes at least one cluster 82 having at least one straight orifice 105. In some embodiments, the gas channel 80 includes a combination of single, straight orifices 105 extending from the gas channel 80 and at least one cluster 82 having at least one straight orifice 105. In some embodiments, the gas channel 80 includes two clusters 82 having at least one straight orifice 105. Each cluster 82 may have any number of straight orifices 105. In one or more embodiments, each cluster 82 has in a range of from 2 straight orifices 105 to 10 straight orifices 105. In some embodiments, each cluster 82 includes 4 straight orifices 105.

Figure 7A:
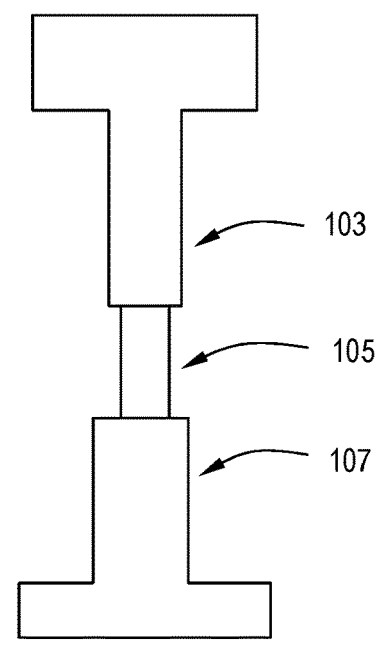
FIG. 7A illustrates a schematic view of a straight orifice of a gas distribution assembly according to one or more embodiments.
Figure 7B:
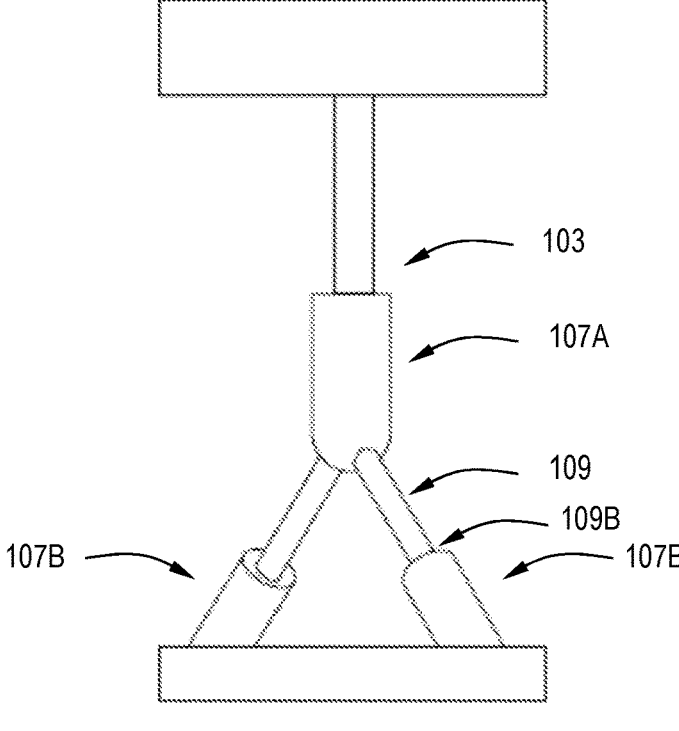
FIG. 7B illustrates a schematic view of an angled orifice of a gas distribution assembly according to one or more embodiments.
Figure 10:
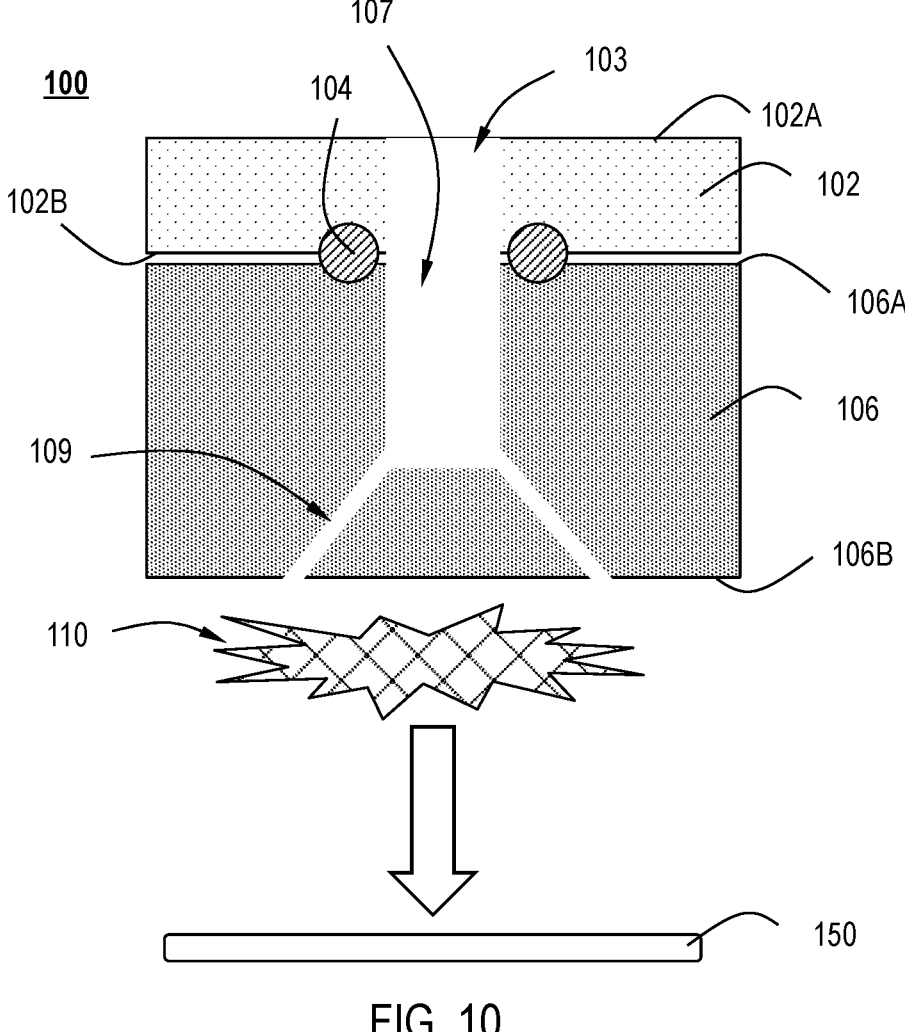
FIG. 10 illustrates a schematic cross-sectional view of a gas distribution assembly having two angled orifices according to one or more embodiments.

In some embodiments, the gas channel 80 includes angled orifices extending from the gas channel 80 (such as the angled orifices 109 shown in FIGS. 7B and 10). In one or more embodiments, the gas channel 80 includes at least one cluster 82 having at least two angled orifices 109. In some embodiments, the gas channel 80 includes a combination of angled orifices 109 extending from the gas channel 80 and at least one cluster 82 having at least two angled orifices 109. In some embodiments, the gas channel 80 includes two clusters 82 having at least two angled orifices 109. Each cluster 82 may have any number of angled orifices 109. In one or more embodiments, each cluster 82 has in a range of from 2 to 10 pairs of angled orifices 109. As used herein, each pair of angled orifices 109 contains two angled orifices 109. In some embodiments, each cluster 82 includes 4 pairs of angled orifices 109. Stated differently, in some embodiments, each cluster 82 includes 8 angled orifices 109.

Referring to FIG. 7A, the gas distribution assembly 100 of one or more embodiments includes at least one straight orifice 105. The at least one straight orifice 105 defines a gas hole that allows gas 110 to pass through the orifice 105 towards the at least one o-ring 104. In some embodiments, there is a continuous flow of gas 110 in the processing chamber (e.g., semiconductor processing chamber 10). In some embodiments, there is a continuous flow of gas 110 surrounding the gas distribution assembly 100.

In one or more embodiments, the gas 110 includes a plasma. Advantageously, the plasma of the gas 110 is extinguished prior to the plasma reaching the location of the at least one o-ring 104 based on the orifice designs of the gas distribution assembly 100 described herein.

The at least one straight orifice 105 may have any suitable diameter and height such that a desired pressure may be maintained in the gas distribution assembly 100 to extinguish the plasma prior to reaching the at least one o-ring 104. It has been discovered that an absolute pressure of greater than or equal to 10 Torr at a location of the at least one o-ring 104 is the pressure minimum to extinguish the plasma. Current orifice designs, as an example, have a diameter of approximately 2 mm and a height of approximately 9 mm. In current orifice designs, the pressure at a location of the o-rings is in a range of from about 3 Torr to about 4 Torr, such that the plasma is not extinguished at the location of the o-rings, and the o-rings are susceptible to plasma damage. Advantageously, the orifices 105 of the present disclosure have dimensions that extinguish the plasma prior to reaching the location of the at least one o-ring 104 and maintain an absolute pressure of greater than or equal to 10 Torr, such as greater than or equal to 11 Torr, greater than or equal to 13.5 Torr, greater than or equal to 25 Torr, greater than or equal to 40 Torr, greater than or equal to 50 Torr, or greater than or equal to 60 Torr, thereby eliminating plasma damage to the o-rings 104.

In some embodiments, the at least one straight orifice 105 has a diameter in a range of from 0.2 mm to 1 mm. In some embodiments, the at least one straight orifice 105 has a diameter in a range of from 0.3 mm to 0.42 mm. In some embodiments, the at least one straight orifice 105 has a diameter of 0.8 mm. In some embodiments, the at least one straight orifice 105 has a height in a range of from 1 mm to 5 mm. In some embodiments, the at least one straight orifice 105 has a height of 4.5 mm.

For example, when the at least one straight orifice 105 has a diameter in a range of from 0.2 mm to 1 mm and a height in a range of from 1 mm to 5 mm, the absolute pressure at a location of the at least one o-ring 104 is greater than or equal to 10 Torr. As an example, the absolute pressure at the location of the at least one o-ring 104 is in a range of from 13.5 Torr to 15 Torr when the at least one straight orifice 105 has a diameter of 1 mm and a height of 4.5 mm. As another example, the absolute pressure at the location of the at least one o-ring 104 is greater than or equal to 60 Torr when the at least one straight orifice 105 has a diameter of 0.5 mm and a height of 4.5 mm. Advantageously, the at least one straight orifice 105 having a diameter in a range of from 0.2 mm to 1 mm and a height in a range of from 1 mm to 5 mm meets the pressure minimum to extinguish the plasma and eliminates plasma damage to the at least one o-ring 104.

The backplate 102 and the faceplate 106 may have any suitable diameter. It has been discovered that the diameter of each of the backplate 102 and the faceplate 106 affect the velocity of the gas 110 through the orifices 105. In some embodiments, the faceplate 106 has a diameter in a range of from about 2 mm to about 3 mm. It has been found that larger diameter holes in the faceplate 106 reduces velocity of the gas 110 exiting the faceplate 106 towards the process gap 68, but plasma may light up in the larger faceplate diameter holes. It has been found that modifications to the diameter of the backplate 102 does not affect the velocity of the gas 110.

In some embodiments, the backplate 102 has a diameter in a range of from 1.2 to 1.4 mm.

The counterbored hole 107 extending through a bottom portion of the thickness of the faceplate 106 may have any suitable diameter. In some embodiments, the counterbored hole 107 has a diameter in a range of from 2 mm to 3 mm. In some embodiments, the counterbored hole 107 has a diameter of 2.03 mm.

In one or more embodiments, the gas distribution assembly 100 includes the opening 103 in the top surface 102A of the backplate 102 having a diameter in a range of from 1.2 mm to 1.4 mm, at least one straight orifice 105 having a diameter in a range of from 0.2 mm to 1 mm and a height in a range of from 1 mm to 5 mm, and a counterbored hole 107 with a diameter in a range of from 2 mm to 3 mm.

The skilled artisan will recognize that the gas distribution assembly 100 includes at least one straight orifice 105 and can include any number of orifices 105 such that the pressure minimum to extinguish the plasma (e.g., the plasma of gas 110) is met and plasma damage to the at least one o-ring 104 is eliminated. In some embodiments, the gas distribution assembly 100 includes one straight orifice 105. In some embodiments, the gas distribution assembly 100 includes two straight orifices 105.

Referring to FIG. 7B, the gas distribution assembly 100 of one or more embodiments includes a backplate 102, a faceplate 106, at least one o-ring 104 that connects the backplate 102 and the faceplate 106, a first counterbored hole 107A extending through a top portion of the thickness 106T of the faceplate 106, at least two angled orifices 109, and a second counterbored hole 107B (e.g., a second pair of counterbored holes). Each of the second counterbored holes 107B extend from a bottom 109B of each of the angled orifices 109 through a bottom portion of the thickness 106T of the faceplate 106.

In the illustrated embodiment of FIG. 7B, the gas distribution assembly 100 includes the opening 103 in the top surface 102A of the backplate 102 having a diameter in a range of from 1.2 mm to 1.4 mm, a first counterbored hole 107A extending through a top portion of the thickness 106T of the faceplate 106 and having a diameter in a range of from 2 mm to 3 mm and a height in a range of from 1 mm to 5 mm, at least two angled orifices 109 independently having a diameter in a range of from 0.2 mm to 1 mm and a height in a range of from 1 mm to 5 mm, and a second pair of counterbored holes 107B (extending from a bottom of each of the angled orifices 109 through a bottom portion of the thickness 106T of the faceplate 106) having a diameter in a range of from 1.5 mm to 3 mm.

Figures 8, 9:
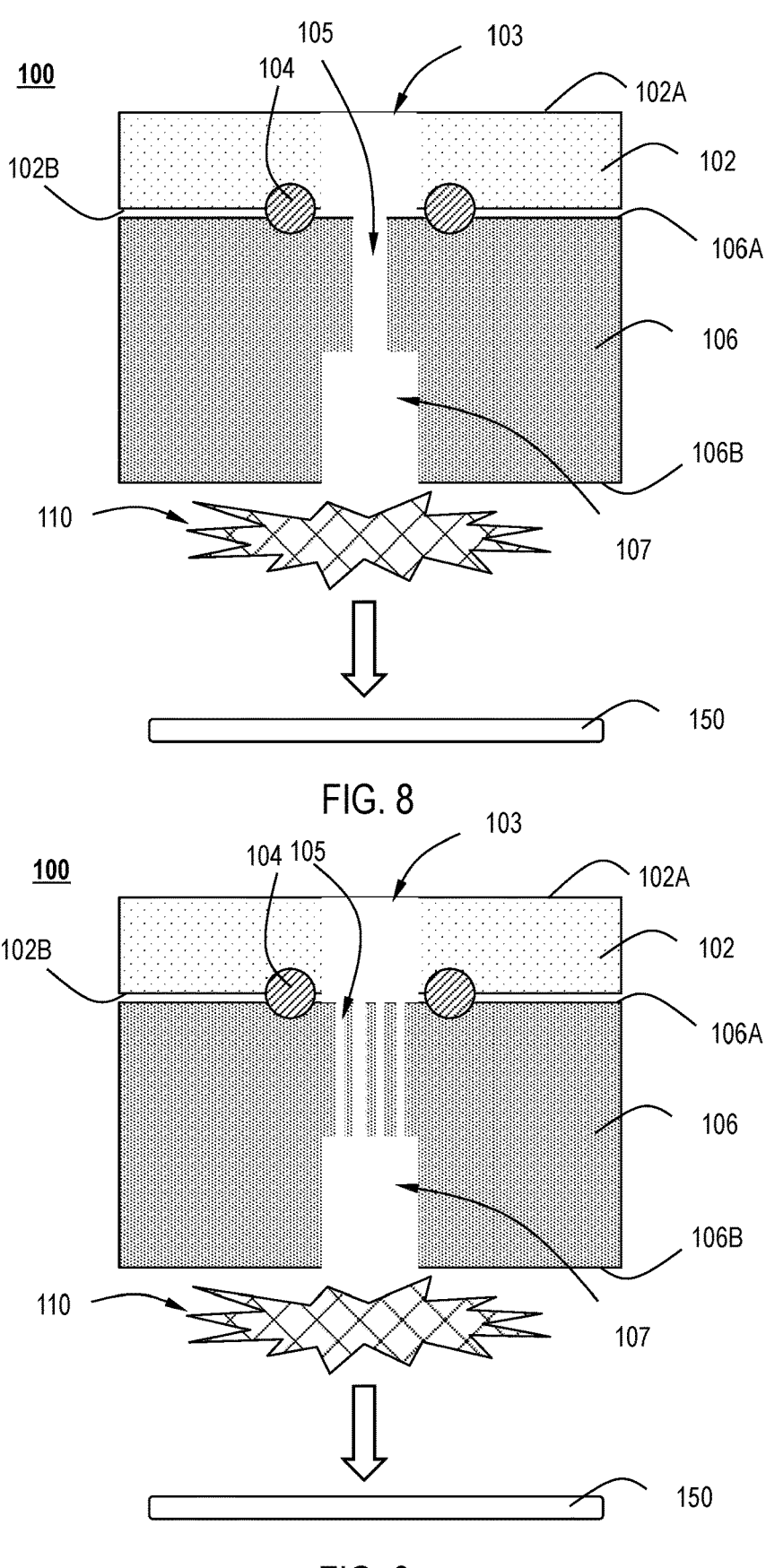
FIG. 8 illustrates a schematic cross-sectional view of a gas distribution assembly having one straight orifice according to one or more embodiments.
FIG. 9 illustrates a schematic cross-sectional view of a gas distribution assembly having four straight orifices according to one or more embodiments.

FIGS. 8-10 illustrate schematic cross-sectional views of the gas distribution assembly 100 having differing orifice configurations. FIG. 8 illustrates a schematic cross-sectional view of the gas distribution assembly 100 having one straight orifice 105. FIG. 9 illustrates a schematic cross-sectional view of the gas distribution assembly 100 having four straight orifices 105. FIG. 10 illustrates a schematic cross-sectional view of the gas distribution assembly 100 having two angled orifices 109.

Referring to FIG. 8, in some embodiments, the gas distribution assembly 100 includes the backplate 102, the faceplate 106, one o-ring 104 (shown in cross-section) that connects the backplate 102 and the faceplate 106, the opening 103, one straight orifice 105, the counterbored hole 107, the gas 110, and the wafer 150. In FIG. 8, for example, the gas distribution assembly 100 includes the opening 103 in the top surface 102A of the backplate 102 having a diameter in a range of from 1.2 mm to 1.4 mm, one straight orifice 105 having a diameter in a range of from 0.2 mm to 1 mm and a height in a range of from 1 mm to 5 mm, and the counterbored hole 107 having a diameter in a range of from 2 mm to 3 mm.

Referring to FIG. 9, in some embodiments, the gas distribution assembly 100 includes the backplate 102, the faceplate 106, one o-ring 104 (shown in cross-section) that connects the backplate 102 and the faceplate 106, the opening 103, four straight orifices 105, the counterbored hole 107, the gas 110, and the wafer 150. In some embodiments, one or more porous plugs (not shown) may be positioned in one or more of the orifices 105. In one or more embodiments, the gas distribution assembly 100 comprises x−1 porous plugs, where x is an integer of straight orifices 105. For example, when x is 4, the gas distribution has 3 porous plugs that are positioned in 3 of the 4 straight orifices 105 to restrict gas flow. It is thought that, in embodiments where the gas distribution assembly 100 comprises x−1 porous plugs and x integer of straight orifices 105, the pressure at the location of the at least one o-ring 104 can be maintained at the pressure minimum so that the plasma is extinguished, and pressure can be increased by restricting gas flow in one or more of the orifices 105.

Some embodiments advantageously provide gas distribution assemblies having angled orifice gas holes that reduce or eliminate plasma damage to o-rings by achieving high pressure in the gas holes and suppressing plasma at the o-ring location, reduce jetting effects, and as a result of the reduction in jetting effects, also improve on-wafer film uniformity.

The skilled artisan will recognize that the gas distribution assembly 100 includes at least two angled orifices 109 and can include any number of angled orifices 109 such that the pressure minimum to extinguish the plasma is met and plasma damage to the at least one o-ring 104 is eliminated.

Referring to FIG. 9, in some embodiments, the gas distribution assembly 100 includes the backplate 102, the faceplate 106, one o-ring 104 (shown in cross-section) that connects the backplate 102 and the faceplate 106, the opening 103, two angled orifices 109, the gas 110, and the wafer 150. The at least two angled orifices 109 independently define a gas hole that allows gas 110 to pass through the orifices 109 towards the at least one o-ring 104.

In one or more specific embodiments, the gas distribution assembly 100 includes two angled orifices 109 and the second pair of counterbored holes 107B (shown in FIG. 7B) extending from a bottom of each of the at least two angled orifices 109 through a bottom portion of the thickness 106T of the faceplate 106. The at least two angled orifices 109 independently define a gas hole that allows gas 110 to pass through the second pair of counterbored holes 107B through the orifices 109 towards the at least one o-ring 104.

The at least two angled orifices 109 may independently have any suitable diameter and height such that a desired pressure may be maintained in the gas distribution assembly 100, e.g., the pressure minimum to extinguish the plasma (e.g., the plasma of the gas 110) prior to reaching the at least one o-ring 104. Advantageously, the absolute pressure at a location of the at least one o-ring 104 is greater than or equal to 10 Torr when the gas distribution assembly 100 includes the at least two angled orifices 109. In some embodiments, the at least two angled orifices 109 independently have a diameter in a range of from 0.2 mm to 1 mm. In some embodiments, the at least two angled orifices 109 independently have a diameter in a range of from 0.3 mm to 0.35 mm. In some embodiments, the at least two angled orifices 109 independently have a diameter in a range of from 0.6 mm to 0.85 mm. In some embodiments, the at least two angled orifices 109 independently have a height in a range of from 1 mm to 5 mm. In some embodiments, the at least two angled orifices 109 independently have a height of 4 mm.

For example, when the at least two angled orifices 109 independently have a diameter in a range of from 0.2 mm to 1 mm and a height in a range of from 1 mm to 5 mm, the absolute pressure at a location of the at least one o-ring 104 is greater than or equal to 10 Torr. As an example, the absolute pressure at the location of the at least one o-ring 104 is in a range of from 17.5 Torr to 19 Torr when the at least two angled orifices 109 independently have a diameter of 0.7 mm and a height of 4 mm. As another example, the absolute pressure at the location of the at least one o-ring 104 is in a range of from 11.5 Torr to 13 Torr when the at least two angled orifices 109 independently have a diameter of 0.85 mm and a height of 4 mm. Advantageously, the at least two angled orifices 109 independently having a diameter in a range of from 0.2 mm to 1 mm and a height in a range of from 1 mm to 5 mm meets the pressure minimum to extinguish the plasma of the gas 110 and eliminates plasma damage to the at least one o-ring 104.

It is thought that the composition of the gas 110 affects the strength of the jetting effect on the wafer 150. It has been discovered that gas 110 comprising one or more of argon (Ar), helium (He), nitrogen ($N_2$), and ammonia ($NH_3$) have different jetting effects. For example, it has been found that argon (Ar) gas 110 flowed at 6 standard liters per minute (slm) has a stronger jetting effect than helium (He) gas 110 flowed at 6 slm with the same heating conditions.

It has been advantageously found that when the at least two angled orifices 109 independently have a diameter in a range of from 0.2 mm to 1 mm, such as 0.7 mm and 0.85 mm, and a height in a range of from 1 mm to 5 mm, such as 4 mm, there is a weak jetting effect on the wafer 150. Advantageously, the jetting effects are reduced when the at least two angled orifices 109 independently have a diameter in a range of from 0.2 mm to 1 mm and a height in a range of from 1 mm to 5 mm compared to a gas distribution assembly that does not include angled orifices, such as the gas distribution assemblies with current orifice designs.

Additional embodiments of the disclosure are directed to a method of reducing plasma damage in a gas distribution assembly. The method comprises: positioning the gas distribution assembly in a processing chamber. The processing chamber includes, but is not limited to, any of the embodiments of the semiconductor processing chamber 10 described herein. The gas distribution assembly includes, but is not limited to, any of the embodiments of the gas distribution assembly 100 described herein. The method further comprises striking a plasma below the bottom surface of the faceplate. The plasma flows through the counterbored hole and the at least one orifice towards the at least one o-ring. The absolute pressure at a location of the least one o-ring is greater than or equal to 10 Torr based on the dimensions of the at least one orifice as described herein, such that the plasma is extinguished prior to reaching the at least one o-ring. In some embodiments, the at least one orifice comprises at least one straight orifice 105. In some embodiments, the at least one orifice includes at least two angled orifices 109 that reduce jetting compared to a gas distribution assembly that does not include angled orifices.

Further embodiments of the disclosure are directed to processing tools, such as a cluster tool or clustered system for the methods described. Any processing tool known to the skilled artisan may be used.

One or more embodiments of the disclosure are directed to a non-transitory computer readable medium including instructions, that, when executed by a controller of a processing chamber, cause the processing chamber to perform the operations of positioning a gas distribution assembly, such as the gas distribution assembly 100 of one or more embodiments, in the processing chamber, such as semiconductor processing chamber 10; and striking a plasma below the bottom surface of the faceplate, the plasma flowing through the counterbored hole and the at least one orifice towards the at least one o-ring, the absolute pressure at a location of the least one o-ring greater than or equal to 10 Torr to extinguish the plasma prior to reaching the at least one o-ring. In some embodiments, the at least one orifice comprises at least one straight orifice 105. In some embodiments, the at least one orifice includes at least two angled orifices 109 that reduce jetting compared to a gas distribution assembly that does not include angled orifices.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A gas distribution assembly for a semiconductor device, the gas distribution assembly comprising:

a backplate having a top surface and a bottom surface defining a thickness, and an opening extending through the thickness;

a faceplate having a top surface and a bottom surface defining a thickness, the top surface of the faceplate spaced a distance from and facing the bottom surface of the backplate, the faceplate and the backplate connected by at least one o-ring;

a first counterbored hole extending through a top portion of the thickness of the faceplate;

at least two angled orifices extending through a bottom portion of the thickness of the faceplate; and a second counterbored hole comprising a pair of counterbored holes, each of the pair of counterbored holes extending from a bottom of each of the at least two angled orifices through a bottom portion of the thickness of the faceplate, wherein the at least two angled orifices independently define a gas hole that allows gas to pass through the orifices towards the at least one o-ring, have a diameter in a range of from 0.2 mm to 1 mm, and have a height in a range of from 1 mm to 5 mm.

2. The gas distribution assembly of claim 1, wherein the opening in the top surface of the backplate has a diameter in a range of from 1.2 mm to 2 mm.

3. The gas distribution assembly of claim 1, wherein the backplate comprises a metallic material.

4. The gas distribution assembly of claim 3, wherein the metallic material is aluminum (Al).

5. The gas distribution assembly of claim 1, wherein the faceplate comprises a ceramic material.

* * * * *